(12) United States Patent
Mohindra

(10) Patent No.: US 6,744,829 B1
(45) Date of Patent: Jun. 1, 2004

(54) CALIBRATION OF A QUADRATURE RECEIVER

(75) Inventor: Rishi Mohindra, Milpitas, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 720 days.

(21) Appl. No.: 09/668,014

(22) Filed: Sep. 21, 2000

(51) Int. Cl.$^7$ .............................................. H04L 27/06
(52) U.S. Cl. ...................................... 375/343; 375/316
(58) Field of Search ............................... 375/343, 316, 375/324, 344

(56) References Cited

U.S. PATENT DOCUMENTS

| | | | | |
|---|---|---|---|---|
| 3,943,514 A | * | 3/1976 | Afendykiw et al. | 342/156 |
| 5,764,705 A | * | 6/1998 | White | 375/324 |
| 5,949,821 A | | 9/1999 | Emami et al. | 375/235 |
| 6,198,777 B1 | * | 3/2001 | Feher | 375/295 |

* cited by examiner

Primary Examiner—Temesghen Ghebretinsae
(74) Attorney, Agent, or Firm—Aaron Waxler

(57) ABSTRACT

A receiver is calibrated. First, it is ensured that an input of the receiver does not receive useful signals. Thereafter, quadrature output signals of the receiver are correlated and a relative phase of quadrature local oscillators signals, which are used to down-convert received signals, is set at a value corresponding to a minimum correlation value.

8 Claims, 3 Drawing Sheets

CALIBRATION OF A QUADRATURE RECEIVER

BACKGROUND OF THE INVENTION

1. Field of the Invention

The present invention relates to calibration of a quadrature receiver. Such a receiver operates in the so-called 2.4 GHz ISM band, for instance, or can be any other suitable receiver.

2. Description of the Related Art

U.S. Pat. No. 5,949,821 discloses a radio communication device that demodulates a signal using in-phase and quadrature components. The radio communication device has an equalizer for correcting phase and gain imbalances that would otherwise distort a received signal. The equalizer determines peak amplitudes for the in-phase and quadrature components of the received signal. The phase imbalance between the in-phase and quadrature components is determined using the peak amplitudes. The peak amplitudes and phase imbalance are used to adjust at least one of the in-phase and quadrature components to correct for any imbalance therebetween. A phase estimator estimates the phase imbalance between the in-phase and quadrature components that were separated from a sampled down-converted received signal by a pair of quadrature mixers by mixing with respective sin($\omega$t) and cos($\omega$t) signals. The phase imbalance is determined as the arcsin function of the product of two over the product of peak amplitude estimates of the uncorrected in-phase and quadrature components and the cross-correlation between the uncorrected in-phase and quadrature components. The equalizer thus corrects amplitude and phase imbalances of a received signal, i.e. a useful signal.

SUMMARY OF THE INVENTION

It is an object of the invention to provide a quadrature receiver with phase adjustment of quadrature components of a local oscillator, thereby using quadrature output signals that represent narrow band noise signals.

It is another object to provide a quadrature receiver wherein such phase adjustment is independent of gain errors in in-phase and quadrature branches of the receiver.

It is another object of the invention to provide a quadrature receiver wherein such phase adjustment uses a phase adjustment signal obtained from cross-correlated quadrature output signals of the receiver.

In accordance with the invention, a method of calibrating a receiver is provided, the method comprising:
- ensuring that an input of said receiver receives no useful signals;
- cross-correlating quadrature output signals provided by said receiver, said quadrature output signals representing noise signals; and
- adjusting a relative phase of quadrature local oscillator signals that are used to generate said quadrature output signals through down-conversion of a received signal, said adjusted relative phase being obtained from said cross-correlated quadrature output signals.

The invention is based on the insight of generating balanced quadrature signals at an early point in the receiver, i.e. at down-conversion of the received signal so that no further complicated corrections are needed, and further on the insight that cross-correlation of low pass filtered noise signals provides a signal that represents a phase imbalance that is independent of gain errors in the in-phase and quadrature branches of the receiver.

In one embodiment, the receiver is a zero-IF receiver. In this embodiment the relative phase of the quadrature local oscillator is set at a minimum cross-correlation value. In this embodiment advantageously DC-offsets in the in-phase and quadrature branches are removed by AC-couplers.

In another embodiment, the receiver is a low-IF receiver. In this embodiment the relative phase of the quadrature local oscillator is set at a zero cross-correlation value.

In order to ensure that no useful signals are received during phase calibration, an input of the receiver may be decoupled from an antenna that receives useful signals. Herewith it is ensured that cross-correlation is purely based on noise signals.

BRIEF DESCRIPTION OF THE DRAWING

Throughout the figures the same reference numerals are used for the same features.

DESCRIPTION OF THE DETAILED EMBODIMENTS

Figure 1:
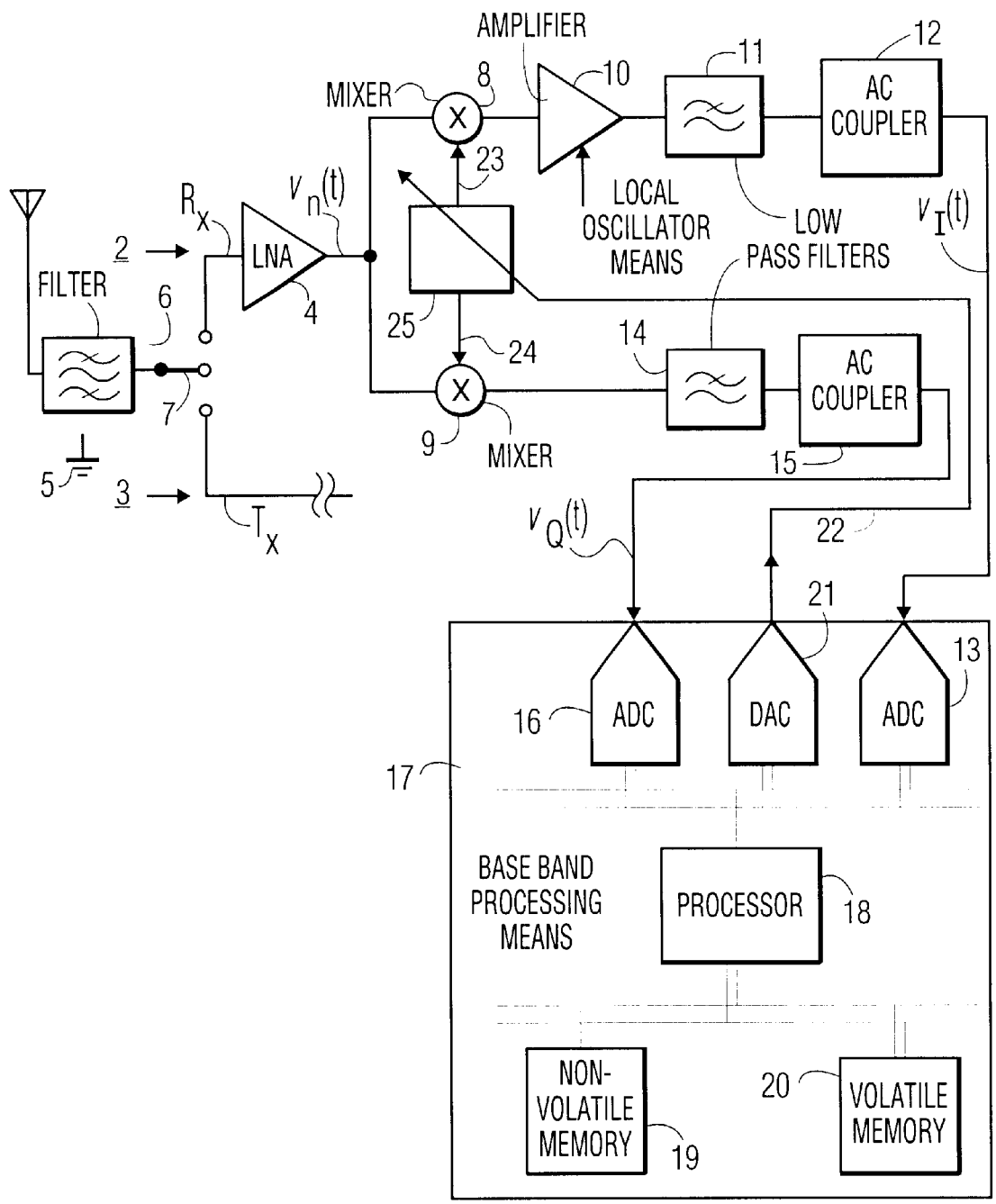
FIG. 1 is a block diagram of a transceiver with a receiver according to the present invention.

FIG. 1 is a block diagram of a transceiver 1 according to the present invention. In the example given, the transceiver 1 operates in the so-called 2.4 GHz ISM (Industrial, Scientific and Medical) band, and is a so-called zero-IF transceiver that receives and transmits at the same frequency so that only a single tuned oscillator is needed. The transceiver 1 can be a so-called zero-IF (Intermediate Frequency) or low-IF transceiver. The transceiver 1 comprises a receive branch 2 and a transmit branch 3. The invention may also be embodied in a receiver. In that case no transmit branch is present. The receive branch 2 comprises a low noise amplifier (LNA) 4 that is coupled to an antenna 5 via a filter 6 and a transmit/receive switch 7. The LNA 4 is coupled to a pair of quadrature mixers 8 and 9 in respective in-phase and quadrature receive branches. Through an adjustable gain amplifier 10, the mixer 8 is coupled to a low pass filter 11. Through an AC-coupler 12, the low pass filter 11 is coupled to an analog-to-digital converter 13. Through a low pass filter 14, the mixer 9 is coupled to an AC-coupler 15. The AC-coupler 15 is coupled to an analog-to-digital converter 16. The AC-couplers 12 and 15 may be provided in case of a zero-IF transceiver in order to remove DC-offset errors in the receive branch 2. The analog-to-digital converters 13 and 16 are part of base band processing means 17 and provide samples of quadrature signals $v_I(t)$ and $v_Q(t)$ that are obtained by down-converting a received radio frequency signal. The quadrature signals $v_I(t)$ and $v_Q(t)$ may be zero-IF or low-IF signals. The base band processing means 17 further comprises a processor 18, a non-volatile memory 19 storing program data and other non-volatile data, a volatile memory 20 for storing volatile data, and a digital-to-analog converter 21 for providing a phase adjustment signal 22 to adjust the relative phase of a pair of quadrature local oscillator signals 23 and 24 provided by local oscillator means 25 comprised in the receive branch 2.

According to the invention, the phase adjustment signal 22 is determined from a noise signal $v_n(t)$ at an output of the low noise amplifier 4. It is assumed that a large part of the noise originates before the mixers, i.e. in the LNA 4.

The noise signal $v_n(t)$ can be written as:

$v_n(t) = n_I(t).\cos(\omega_c t) - n_Q(t).\sin(\omega_c t)$, wherein $n_I(t)$ and $n_Q(t)$ are zero-mean Gaussian random variables that are mutually independent and $\omega_c$ is a local oscillator frequency.

After quadrature down-conversion and low pass filtering the quadrature signals $v_I(t)$ and $v_Q(t)$ are obtained from the noise signal $v_n(t)$.

Figure 3:
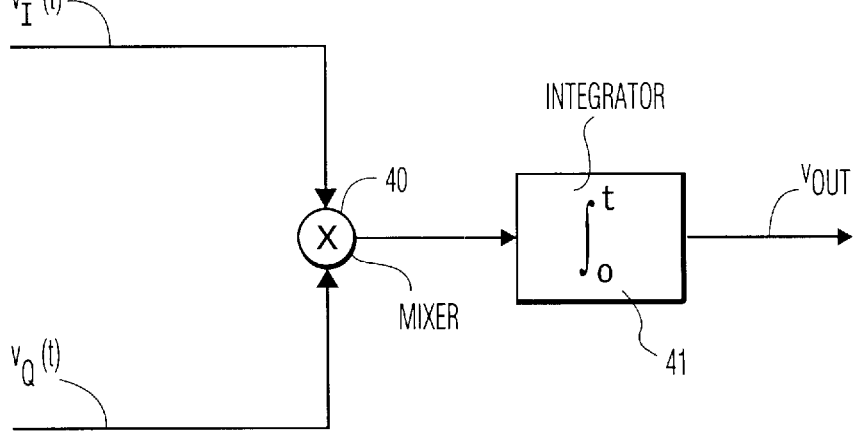
FIG. 3 shows cross-correlation of low pass filtered signals according to the present invention.

As shown in FIG. 3, cross correlation and thereafter integration provides a signal $v_{OUT}$ that is represents the phase imbalance. In case of a low-IF receiver the relative phase of the local oscillator is adjusted until cross-correlation provides a substantially zero output signal. In case of a zero-IF receiver the relative phase of the local oscillator is adjusted until cross-correlation provides a minimum output signal.

In addition to the above, the following holds:

$v_I(t) = \text{LPF}[v_n(t).\cos(\omega_c t)] = n_I(t)$, LPF representing low pass filtering.

$v_Q(t) = \text{LPF}[v_n(t).\alpha.\sin(\omega_c t + \theta)]$, $\alpha$ being the gain imbalance and $\theta$ being the phase error.

After substitution of $v_n(t) = n_I(t).\cos(\omega_c t) - n_Q(t).\sin(\omega_c t)$ into the above expression for $v_Q(t)$ it follows:

$v_Q(t) = \text{LPF}[\{n_I(t).\cos(\omega_c t) - n_Q(t).\sin(\omega_c t)\}.\alpha.\sin(\omega_c t + \theta)]$ Applying basic goniometric formulas, it follows:

$v_Q(t) = -\alpha.\cos(\theta).n_Q(t) + \alpha.\sin(\theta).n_I(t)$

Through low pass filtering for vI(t) it holds:

$v_I(t) = n_I(t)$

Cross correlating of $v_I(t)$ and $v_Q(t)$ provides a signal of which a minimum is independent of the gain error $\alpha$:

$\alpha.\sin(\theta)[n_I(t) * n_I(t)] = K.\sin(\theta)$, *being a cross-correlation operator and K being a constant.

In accordance with invention, the relative phase of the quadrature local oscillator is set at a minimum cross-correlation value, thereby minimizing the quadrature phase imbalance.

Figure 2:
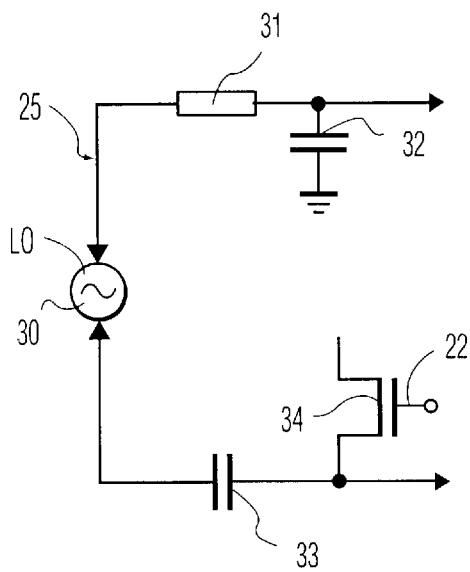
FIG. 2 is a circuit diagram showing an embodiment of phase adjustment of a local oscillator according to the present invention.

FIG. 2 is a circuit diagram showing an embodiment of phase adjustment of the local oscillator means 25 according to the present invention. The local oscillator means 25 comprises a local oscillator 30 which can be a VCO (Voltage Controlled Oscillator) controlled by a PLL (Phase Locked Loop) to which a stable reference oscillator signal is provided. Via an RC-circuit of a resistor 31 and a capacitor 32 first quadrature LO-signal is obtained, and via an RC-circuit of a capacitor 33 and a controlled field effect transistor 34 a second quadrature LO-signal is obtained, when balanced the first and second quadrature LO-signals exhibiting relative phase of 90°. The DAC 21 provides the phase adjustment signal 22 to the field effect transistor 34, the phase adjustment signal 22 being proportional to the phase error.

FIG. 3 shows cross-correlation of low pass filtered signals according to the present invention. The low pass filtered quadrature signals $v_I(t)$ and $v_Q(t)$ are provided to inputs of a mixer 40 that is coupled to an integrator 41.

Figure 4:
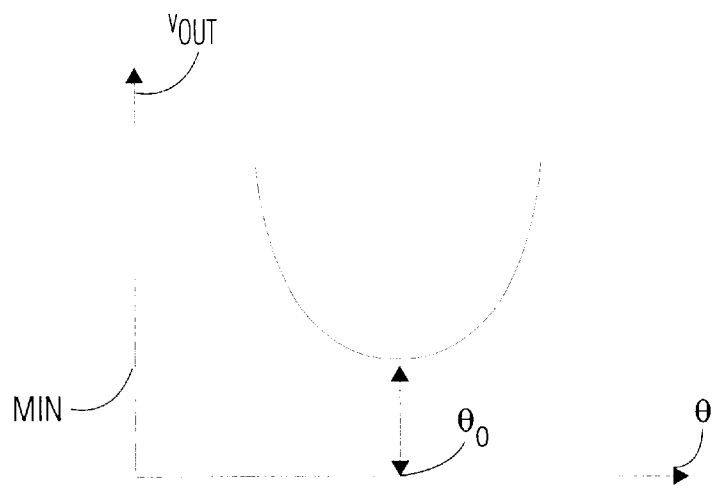
FIG. 4 illustrates cross-correlation in a zero-IF receiver according to the present invention.

FIG. 4 illustrates cross-correlation in a zero-IF receiver according to the present invention. Shown is the signal $v_{OUT}$ as a function of the phase error $\theta$. The phase adjustment signal 22 is set a value corresponding to the phase $\theta = \theta_0$ at a minimum value MIN of the signal $v_{OUT}$.

Figure 5:
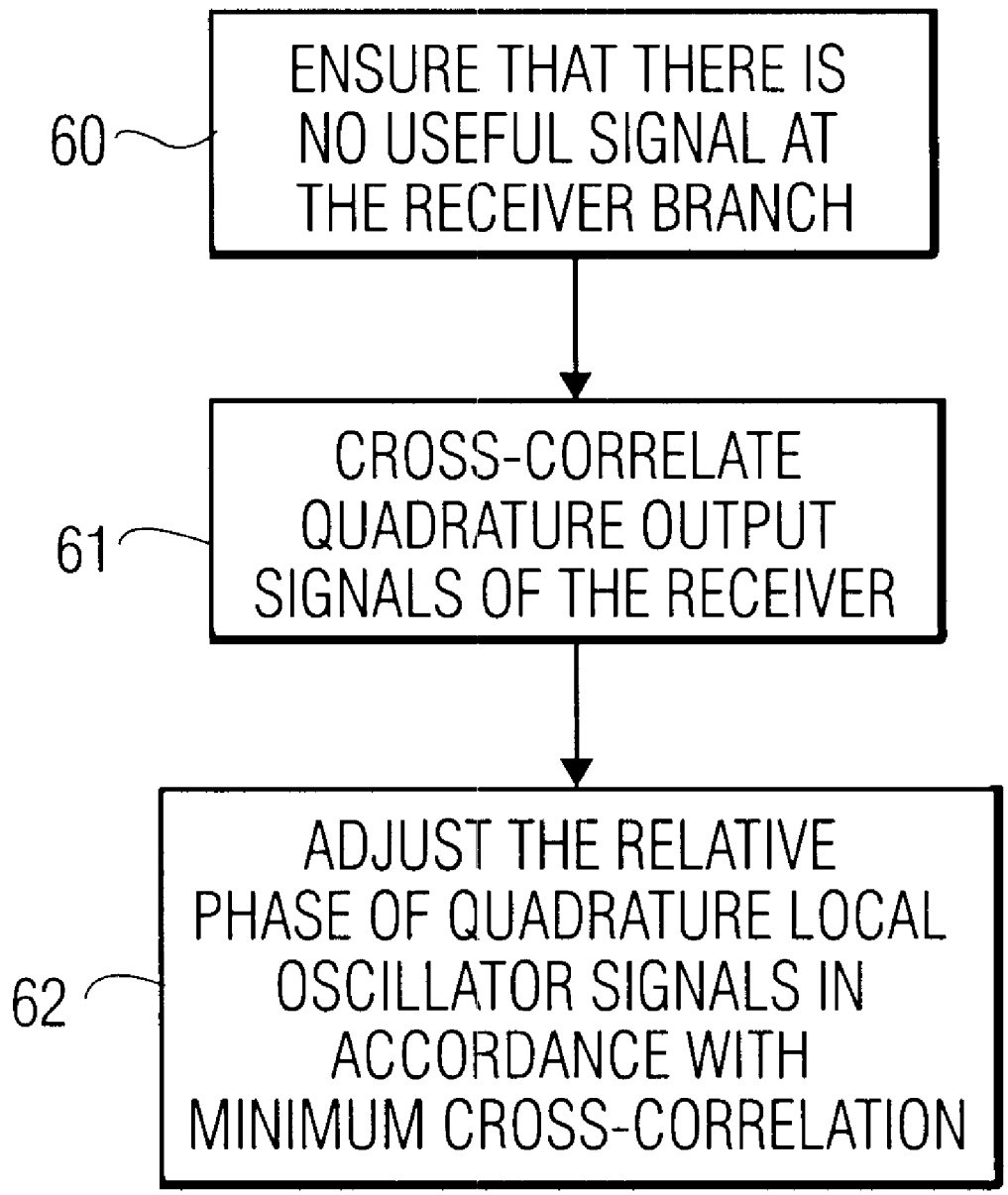
FIG. 5 is a flow-chart illustrates phase adjustment according to the invention.

FIG. 5 is a flow-chart illustrates phase adjustment according to the invention. In block 60, it is ensured that there is no useful signal at the input of the receiver branch 2. In block 61, quadrature output signals of the receiver are cross-correlated. In block 62, the relative phase of the quadrature local oscillators is adjusted in accordance with a minimum cross-correlation value.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A method of calibrating a receiver, said method comprising:
   ensuring that an input of said receiver receives no useful signals;
   cross-correlating quadrature output signals provided by said receiver, said quadrature output signals representing noise signals; and
   adjusting a relative phase of quadrature local oscillator signals that are used to generate said quadrature output signals through down-conversion of a received signal, said adjusted relative phase being obtained from said cross-correlated quadrature output signals.

2. A method as claimed in claim 1, wherein said noise signals are narrow band limited noise signals.

3. A method as claimed in claim 1, therein adjusting said relative phase at a minimum cross-correlation output value of said cross-correlating.

4. A method as claimed in claim 3, wherein said receiver is a low intermediate frequency receiver, and said minimum cross correlation value substantially is zero.

5. A receiver comprising:
   quadrature down-conversion means for providing quadrature down-converted signals from a received signal;
   local oscillator means for providing quadrature local oscillator signals to said quadrature down-conversion means;
   low pass filtering means for providing low pass filtered signals from said quadrature down-converted signals;
   cross-correlating means for cross-correlating said low pass filtered signals, said low pass filtered signals representing noise signals; and
   adjusting means for adjusting a relative phase of said quadrature local oscillator signals, said adjusted relative phase being obtained from said cross-correlated low pass filtered signals, wherein said adjusting means are configured to adjust said relative phase at a minimum cross-correlation output value of said cross-correlating, wherein said receiver is a zero intermediate frequency receiver, said receiver further comprising AC-de-coupling means for removing DC-offset signal components from said low pass filtered signals.

6. A receiver comprising:
   quadrature down-conversion means for providing quadrature down-converted signals from a received signal;

local oscillator means for providing quadrature local oscillator signals to said quadrature down-conversion means;

low pass filtering means for providing low pass filtered signals from said quadrature down-converted signals;

cross-correlating means for cross-correlating said low pass filtered signals, said low pass filtered signals representing noise signals; and adjusting means for adjusting a relative phase of said quadrature local oscillator signals, said adjusted relative phase being obtained from said cross-correlated low pass filtered signals, further comprising means for de-coupling an input of said receiver from an antenna comprised in said receiver so as to ensure that said receiver does not receive useful signals.

7. A receiver comprising:

a quadrature down-convertor configured to providing quadrature down-converted signals from a received signal;

a local oscillator configured to provide quadrature local oscillator signals to said quadrature down-convertor;

a first and a second low pass filter repectively providing low pass filtered signals from said quadrature down-converted signals;

a cross-correlator cross-correlating said low pass filter signals, said low pass filtered signals representing noise signals; and a controller configured to adjust a relative phase of said quadrature local oscillator signals, said adjusted relative phase being obtained from said cross-correlated low pass filtered signals, wherein said receiver is a zero intermediate frequency receiver, said receiver further comprising AC-decoupling means for removing DC-offset signal components from said low pass filtered signals.

8. A receiver comprising:

a quadrature down-convertor configured to providing quadrature down-converted signals from a received signal;

a local oscillator configured to provide quadrature local oscillator signals to said quadrature down-convertor;

a first and a second low pass filter respectively providing low pass filtered signals from said quadrature down-converted signals;

a cross-correlator cross-correlating said low pass filtered signals, said low pass filtered signals representing noise signals; and a controller configured to adjust a relative phase of said quadrature local oscillator signals, said adjusted relative phase being obtained from said cross-correlaLed low pass filtered signals, said receiver further comprising a de-coupler decoupling an input of said receiver from an antenna comprised in said receiver so as to ensure that said receiver does not receive useful signals.

* * * * *